United States Patent
Kim

(10) Patent No.: US 7,683,657 B2
(45) Date of Patent: Mar. 23, 2010

(54) CALIBRATION CIRCUIT OF ON-DIE TERMINATION DEVICE

(75) Inventor: Ki-Ho Kim, Kyoungki-do (KR)

(73) Assignee: Hybix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 12/099,350

(22) Filed: Apr. 8, 2008

(65) Prior Publication Data

US 2009/0146683 A1  Jun. 11, 2009

(30) Foreign Application Priority Data

Dec. 11, 2007  (KR) .................... 10-2007-0128238

(51) Int. Cl.
*H03K 17/16* (2006.01)
*H03K 19/003* (2006.01)

(52) U.S. Cl. ............................. 326/30; 326/34; 326/87

(58) Field of Classification Search .................. 326/30, 326/32–34, 87
See application file for complete search history.

(56) References Cited

U.S. PATENT DOCUMENTS 7,268,712 B1* 9/2007 Sheen .................... 341/120
2007/0188187 A1* 8/2007 Oliva et al. .............. 326/30

FOREIGN PATENT DOCUMENTS

KR 1020070036578 A 4/2007
KR 1020080018779 A 2/2008

OTHER PUBLICATIONS

Notice of Allowance issued from Korean Intellectual Property Office on Jun. 11, 2009 with an English Translation.

* cited by examiner

*Primary Examiner*—Anh Q Tran
(74) *Attorney, Agent, or Firm*—IP & T Law Firm PLC

(57) ABSTRACT

A calibration circuit of an on-die termination device includes a code generating unit configured to receive a voltage of a calibration node and a reference voltage, to generate calibration codes. The calibration unit also includes a calibration resistor unit having parallel resistors which are turned on/off in response to each of the calibration codes and connected to the calibration node, a turn-on strength of at least one of the parallel resistors being controlled by a control signal.

17 Claims, 4 Drawing Sheets

CALIBRATION CIRCUIT OF ON-DIE TERMINATION DEVICE

CROSS-REFERENCE TO RELATED APPLICATIONS

The present invention claims priority of Korean patent application number 10-2007-0128238, filed on Dec. 11, 2007, which is incorporated by reference in its entirety.

BACKGROUND OF THE INVENTION

The present invention relates to a technology of minimizing a mismatch between a termination circuit and a calibration circuit of an on-die termination (ODT) device used for impedance matching in a semiconductor memory device.

Semiconductor devices are implemented into integrated circuit (IC) chips such as central processing units (CPUs), memories, and gate arrays, and are incorporated into a variety of electrical products such as personal computers, servers and workstations. Most semiconductor devices include a receiving circuit configured to receive signals from the outside via input pads and an output circuit configured to provide internal signals to the outside via output pads.

A tendency toward high-speed operation of such electronic products brings about a small swing width for an interface signal between the semiconductor devices, in order to reduce a delay time taken in signal transfer. However, such a trend to gradually reduce the swing width of the signal influences external noise, and further, signal reflection caused by impedance mismatch in an interface terminal becomes critical. Such impedance mismatch is generally caused by external noise, variation of power supply voltage, change in operating temperature, change in manufacturing process, etc. The impedance mismatch may lead to difficulty in high-speed transmission of data and distortion in output data. If a distorted output signal is transmitted, a set-up/hold time failure or an input level decision error, etc., may often occur at a receiving side.

In particular, in order to resolve the above problems, a memory device requiring high-speed performance employs an impedance matching circuit, which is called an ODT circuit, near an input pad inside an IC chip. In a typical ODT scheme, source termination is performed at the transmitting end by an output circuit, and parallel termination is performed by a termination circuit connected in parallel with respect to a receiving circuit coupled to the input pad.

ZQ calibration refers to a procedure of generating pull-up and pull-down calibration codes which vary with PVT (process, voltage and temperature) conditions. The resistance of the ODT device, e.g., termination resistance at a DQ pad in a memory device, is calibrated using the pull-up and pull-down codes achieved from the ZQ calibration. Here, the term of ZQ calibration is derived from the fact that the calibration is performed using a calibration node (ZQ).

Hereinafter, how the ZQ calibration is performed in an ODT device will be described.

FIG. 1 is a block diagram of a calibration circuit configured to perform ZQ calibration in a conventional ODT device.

Referring to FIG. 1, the conventional ODT device includes a pull-up calibration resistor unit 110, a dummy calibration resistor unit 120, a pull-down calibration resistor unit 130, a reference voltage generator 102, comparators 103 and 104, and counters 105 and 106. The pull-up calibration resistor unit 110 includes a plurality of pull-up resistors, which are turned on/off in response to each of pull-up calibration codes PCODE<0:N>. The dummy calibration resistor unit 120 has the same configuration as the pull-up calibration resistor unit 110. The pull-down calibration resistor unit 130 includes a plurality of pull-down, resistors which are turned on/off in response to each of pull-down calibration codes NCODE<0:N>.

The pull-up calibration resistor unit 110 generates the pull-up calibration codes PCODE<0:N> primarily while being calibrated with an external resistor 101 connected to a calibration node ZQ. The dummy calibration resistor unit 120 and the pull-down calibration resistor unit 130 generate the pull-down calibration codes NCODE<0:N> secondarily using the pull-up calibration codes PCODE<0:N> that have been generated by the pull-up calibration resistor unit 110.

The comparator 103 compares a voltage at the calibration node ZQ with a reference voltage VREF (generally set to VDDQ/2) generated from the reference voltage generator 102, thereby generating up/down signals (UP/DOWN). Herein, the voltage at the calibration node ZQ is generated by coupling the pull-up calibration resistor unit 110 to the external resistor 101 (generally, 240Ω) connected to a ZQ pin that is disposed outside a chip of the calibration node ZQ.

The counter 105 receives the up/down signals (UP/DOWN) to generate the pull-up calibration codes PCODE<0:N> as binary code, which turns on/off the pull-up resistors connected in parallel, thereby calibrating total resistance of the pull-up calibration resistor unit 110. The calibrated resistance of the pull-up calibration resistor unit 110 affects the voltage of the calibration node ZQ again, and the above-described calibration procedure is then repeated. That is, the pull-up calibration resistor unit 110 is calibrated such that the total resistance of the pull-up calibration resistor unit 110 is equal to the resistance of the external resistor 101, which is called a pull-up calibration.

The binary code, i.e., the pull-up calibration codes PCODE<0:N> generated during the pull-up calibration, is inputted to the dummy calibration resistor unit 120, thus determining total resistance of the dummy calibration unit 120. In the result, the resistance of the dummy calibration resistor unit 120 is equal to that of the pull-up calibration unit 110. Thereafter, a pull-down calibration is performed in a manner similar to the pull-up calibration. Specifically, the pull-down calibration unit 130 is calibrated such that a voltage at a node A is equal to the reference voltage VREF using the comparator 104 and the counter 106, that is, the total resistance of the pull-down calibration resistor unit 130 is equal to the total resistance of the dummy calibration resistor unit 120, which is called a pull-down calibration.

The binary codes PCODE<0:N> and NCODE<0:N> achieved from the ZQ calibration, i.e., pull-up and pull-down calibrations, are inputted to pull-up and pull-down resistors (termination resistors) at input/output pads, which are similarly configured in the pull-up and pull-down calibration resistor units 110 and 130 of the calibration circuit shown in FIG. 1, thus determining the resistance of the ODT device. In a memory device, resistances of pull-up and pull-down resistors at a DQ pad are determined.

FIG. 2 is a block diagram illustrating how termination resistance of an output driver (termination circuit) of a semiconductor memory device is determined using the calibration codes PCODE<0:N> and NCODE<0:N> generated from the calibration circuit of FIG. 1.

The output driver configured to output data in the semiconductor memory device includes pre-drivers 210 and 220 provided in up/down circuits, and pull-up and pull-down termination resistor units 230 and 240 for outputting data.

The pre-drivers 210 and 220 provided in the up/down circuits control the pull-up termination resistor unit 230 and the pull-down resistor unit 240, respectively. When high-level data is outputted, the pull-up termination resistor unit 230 is turned on so that a data pin DQ goes 'HIGH'. On the contrary, when low-level data is outputted, the pull-down termination resistor unit 240 is turned on so that the data pin DQ goes 'LOW'. That is, the data pin DQ is pull-up or pull-down terminated to thereby output high- or low-level data.

The number of resistors in the pull-up termination resistor unit 230 to be turned on is determined by the pull-up calibration codes PCODE<0:N>, and the number of resistors in the pull-down termination resistor unit 240 to be turned on is determined by the pull-down calibration codes NCODE<0:N>. Specifically, which one is turned on as between the pull-up and pull-down termination resistor units 230 and 240 is mainly determined according to a logic level of output data, but how many resistors are turned on among the resistors provided in the termination resistor units 230 or 240 is determined by the pull-up calibration codes PCODE<0:N> or the pull-down calibration codes NCODE<0:N>.

For reference, target resistances of the pull-up and pull-down termination resistor units 230 and 240 are not necessarily equal to resistances (240Ω) of the calibration resistor units (see calibration resistor units 110, 120 and 130 of FIG. 1), but may be one-half (120Ω) or one-quarter (60Ω) of 240Ω, etc. Since the termination resistance may be changed according to an application system, the termination resistor units 230 and 240 for 240 Ω, 120Ω and 60Ω are all provided and they may be selectively used if necessary. In FIG. 2, reference symbols DQP_CTRL and DQN_CTRL denote various exemplary control signals inputted to the pre-drivers 210 and 220.

The calibration operation of the ODT device is proposed assuming that the calibration units 110 and 130 of the calibration circuit of FIG. 1 have the same configurations as the termination resistor units 230 and 240 of the termination circuit of FIG. 2, and thus they are equally affected by PVT variations. However, the configuration at a side of the ZQ pad of the calibration circuit of FIG. 1 is not completely identical to the configuration at a side of the DQ pad of the termination circuit of FIG. 2. For example, while the pull-up calibration resistor unit 110 is connected to the calibration node ZQ and the pull-down calibration resistor unit 130 is connected to the node A in the calibration circuit of FIG. 1, both of the pull-up and pull-down termination resistor units 230 and 240 of the termination circuit of FIG. 2 are connected to the DQ pad. Further, there is a difference in target resistance between the calibration circuit of FIG. 1 and the termination circuit of FIG. 2. Therefore, a mismatch inevitably exists between the calibration circuit of FIG. 1 and the termination circuit of FIG. 2.

Consequently, even after the calibration operation is performed, the termination resistance of the termination circuit still may be lower or greater than the target resistance.

SUMMARY OF THE INVENTION

Embodiments of the present invention are directed to providing a calibration circuit of an on-die termination (ODT) device, which is capable of reducing a mismatch occurring between a termination circuit and a calibration circuit in the ODT device.

Basically, on/off states of parallel resistors are determined by a calibration code like the conventional calibration circuit. However, the turn-on strengths of some of the parallel resistors can be controlled by a control signal, causing a slight change in resistance. Therefore, this also changes the calibration code, and this change of the calibration code is then reflected in the resistance of a termination circuit. Consequently, a termination resistance can be equal to a target resistance.

Basically, on/off states of parallel resistors in pull-up and pull-down calibration units are determined by pull-up and pull-down calibration codes like the conventional calibration circuit. However, the turn-on strengths of some of the parallel resistors can be controlled by pull-up and pull-down control signals, thus changing the pull-up and pull-down calibration codes. Consequently, resistances of the pull-up and pull-down termination resistor units are also changed so that termination resistances can be equal to a target resistance.

In accordance with an aspect of the invention, there is provided a code generating unit configured to receive a voltage of a calibration node and a reference voltage to generate calibration codes and a calibration resistor unit comprising parallel resistors which are turned on/off in response to each of the calibration codes and connected to the calibration node, a turn-on strength of at least one of the parallel resistors being controlled by a control signal.

DESCRIPTION OF SPECIFIC EMBODIMENTS

Hereinafter, a calibration circuit of an on-die termination (ODT) device in accordance with the present invention will be described in detail with reference to the accompanying drawings.

Figure 1:
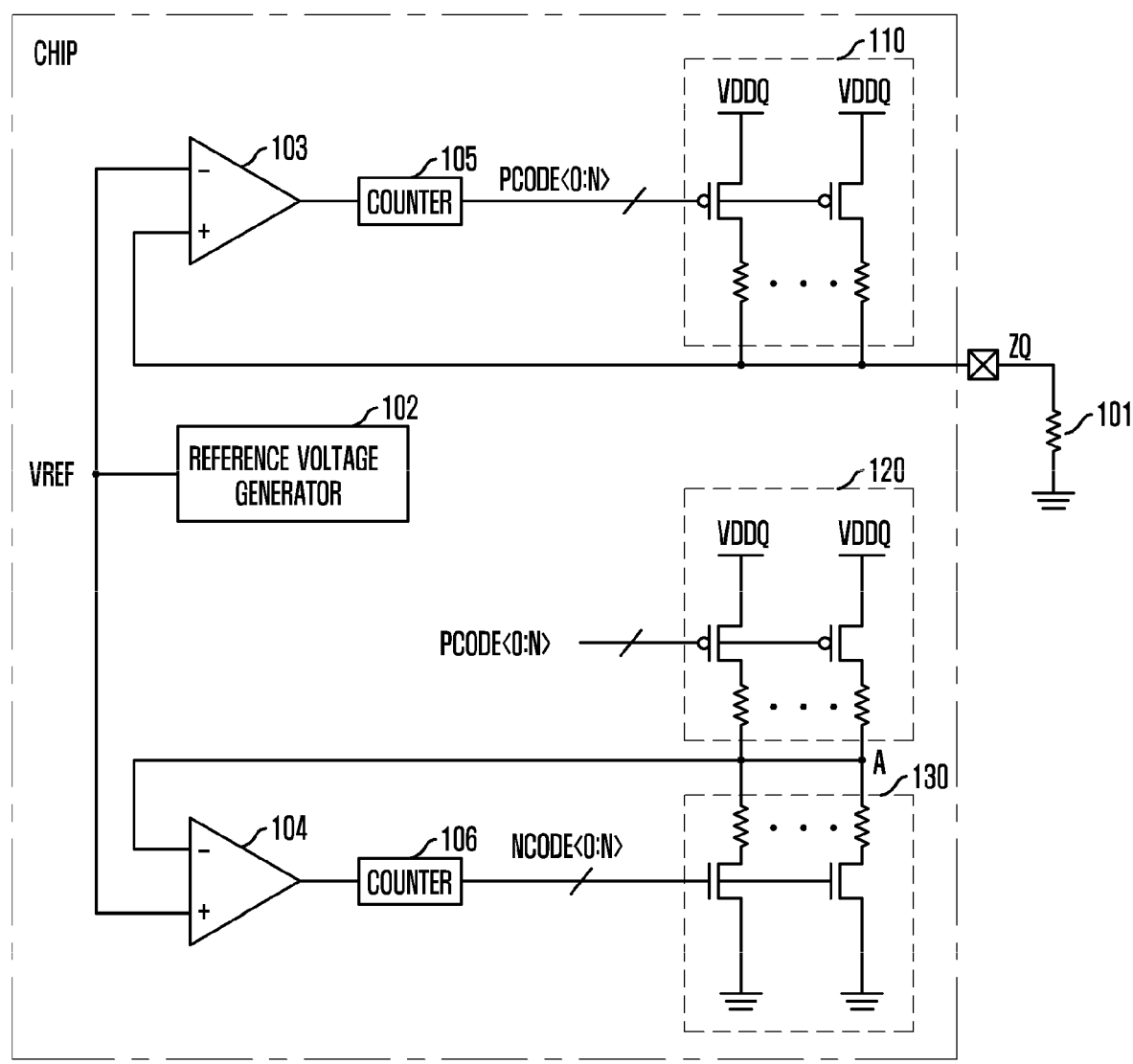
FIG. 1 is a block diagram of a calibration circuit configured to perform ZQ calibration in a conventional on-die termination (ODT) device.
Figure 2:
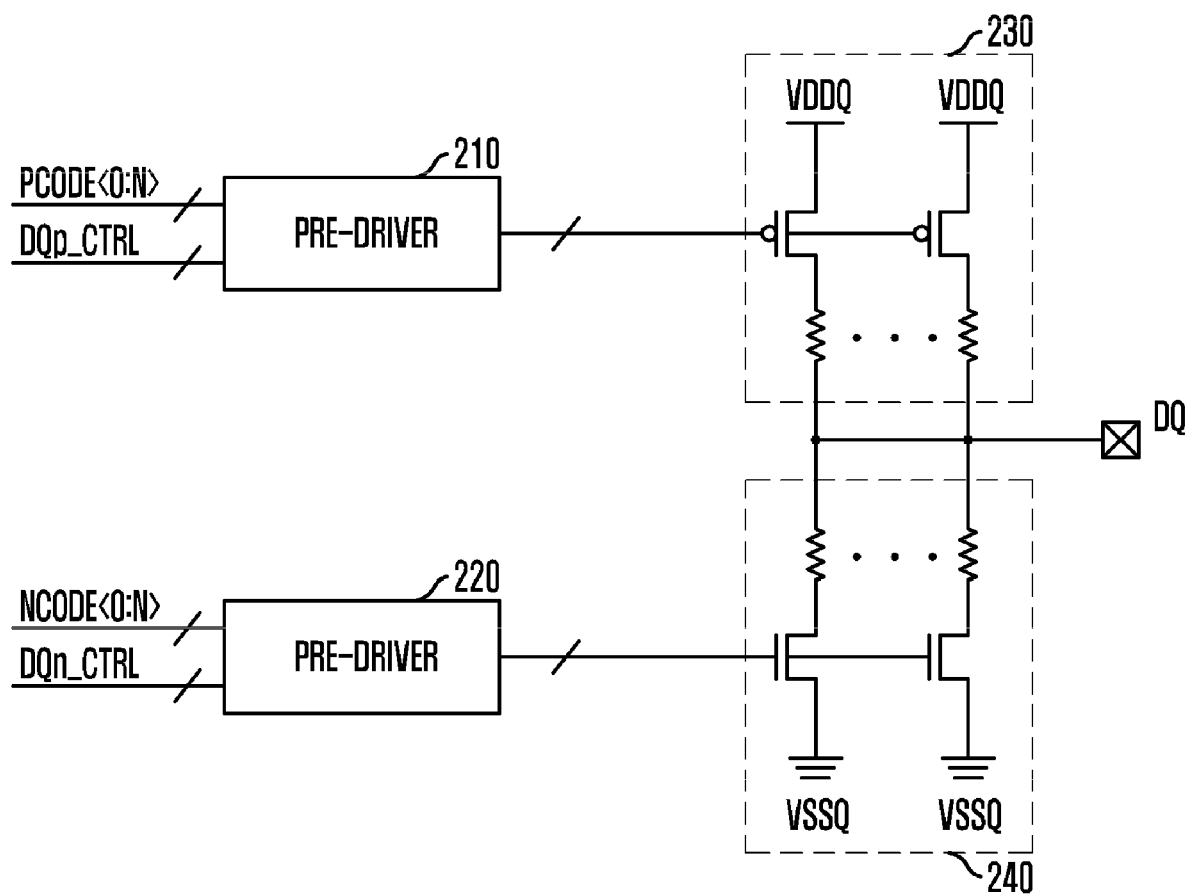
FIG. 2 is a block diagram illustrating how termination resistance of an output driver (termination circuit) of a semiconductor memory device is determined using the calibration codes (PCODE<0:N> and NCODE<0:N>) generated from the calibration circuit of FIG. 1.
Figure 3:
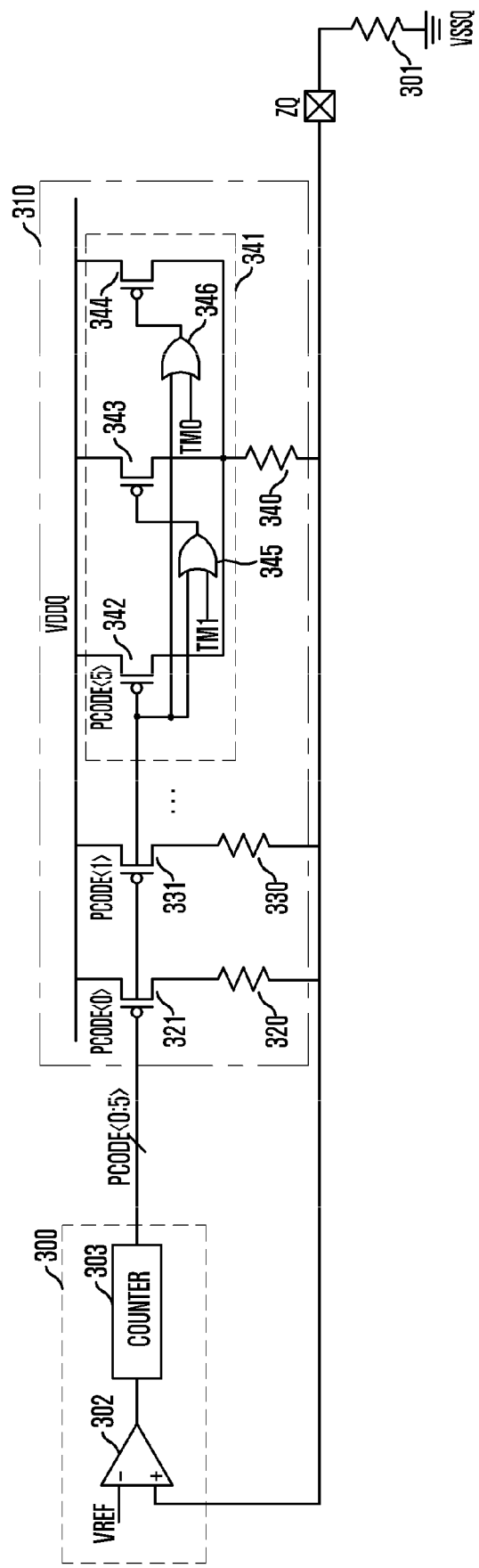
FIG. 3 is a block diagram of a calibration circuit of an ODT device in accordance with an embodiment of the invention.

FIG. 3 is a block diagram of a calibration circuit of an ODT device in accordance with an embodiment of the invention.

In the embodiment of FIG. 3, a calibration circuit generating only one kind of calibration codes PCODE<0:N> is illustrated because the calibration circuit does not always generate two kinds of calibration codes PCODE<0:N> and NCODE<0:N>. In the case where an input/output node (DQ) is only pull-up or pull-down terminated in a termination circuit, the calibration circuit also generates only one kind of calibration codes, i.e., pull-up calibration codes PCODE<0:N> or pull-down calibration codes NCODE<0:N>.

For example, if the calibration circuit is used to determine termination resistance of an output driver, the calibration circuit should generate both the pull-up calibration code PCODE<0:N> and the pull-down calibration code NCODE<0:N> because the output driver pull-up and pull-down terminates the input/output node. However, if the calibration circuit is used to determine termination resistance of an input buffer, the calibration circuit should generate only the pull-up calibration code PCODE<0:N> because the input buffer pull-up terminates the input/output node (DQ).

The calibration circuit in accordance with the embodiment of the invention includes a code generating unit 300 and a calibration resistor unit 310. The code generating unit 300 receives a voltage of a calibration node ZQ and a reference voltage VREF to generate the calibration codes PCODE<0:N>, for example, the calibration codes PCODE<0:5>. The calibration resistor unit 310 includes parallel resistors 320, 330 and 340 which are connected to the calibration node ZQ and turned on/off in response to each of the calibration codes PCODE<0:5>. The turn-on strength of at least one of the parallel resistors 320, 330 and 340, for example, the parallel resistor 340, is controlled by control signals TM0 and TM1.

The code generating unit 300 includes a comparator 302 configured to compare the voltage of the calibration node ZQ connected to an external resistor 301 with the reference voltage VREF, and a counter 303 configured to count the calibration codes PCODE<0:5> according to the comparison result of the comparator 302. Therefore, like the conventional calibration circuit, the calibration codes PCODE<0:5> have values to make the total resistance of the calibration resistor unit 310 equal to that of the external resistor 301.

Specifically, the calibration resistor unit 310 includes switches 321, 331 and 341 configured to be turned on/off in response to each of the calibration codes PCODE<0:5>, and the parallel resistors 320, 330 and 340 configured to be parallel-connected to the calibration node ZQ and respectively turned on/off by the switches 321, 331 and 341. Here, the turn-on strength of at least one of the switches 321, 331 and 341, for example, the switch 341, is controlled by control signals TM0 and TM1.

Whether or not the switch 341, of which the turn-on strength is controlled, is turned on or off, that is, on/off state of the switch 341, is determined by the calibration code PCODE<5>, but its turn-on strength is controlled by the control signals TM0 and TM1.

The switch 341, of which turn-on strength is controlled, includes a plurality of transistors 342, 343 and 344 connected in parallel. On/off states of the transistors 342, 343 and 344 are determined by the calibration code PCODE<5> assigned to thereto, but how many transistors are turned on among the transistors 342, 342 and 344, that is, number of transistors to be used, is determined by the control signals TM0 and TM1.

To this end, the switch 341 may be designed such that some of the transistors, for example, the transistors 343 and 344, are turned off according to the control signals TM0 and TM1 regardless of the calibration code PCODE<5>. In detail, the transistors 343 and 344 do not directly receive the calibration code PCODE<5>, but respectively receives output signals of OR gates 345 and 346 performing OR operation on the control signals TM0 and TM1 and the calibration code PCODE<5>. Therefore, when the control signals TM0 and TM1 are activated, the transistors 343 and 344 are always turned off regardless of the calibration code PCODE<5>.

In accordance with the invention, the turn-on strength of the parallel resistor 340 in the calibration resistor unit 310 is controlled by the control signals TM0 and TM1. If the turn-on strength of the switch 341 is controlled by the control signals TM0 and TM1, the amount of current flowing through the parallel resistor 340 is changed, which has an effect on a voltage level of the calibration node ZQ. Further, because the voltage level of the calibration node ZQ is changed, values of the calibration codes PCODE<0:5> are also changed.

In accordance with the invention, it is possible to change the values of the calibration codes PCODE<0:5> generated in the calibration circuit according to the control signals TM0 and TM1. The values of the calibration codes PCODE<0:5> determine the termination resistance of the termination circuit. Therefore, if there is an error between the termination resistance and the target resistance, levels of the control signals TM0 and TM1 are adjusted to change the values of the calibration codes PCODE<0:5>, thus making the termination resistance equal to the target resistance.

That is, a mismatch between the calibration circuit and the termination circuit is corrected by simply adjusting the logic levels of the control signals TM0 and TM1.

Although FIG. 3 exemplarily illustrates that the turn-on strength of only one resistor 340 is controlled, the invention is not limited thereto. Therefore, the invention is also applicable to the case where the turn-on strengths of a plurality of resistors, e.g., the resistors 330 and 340, are controlled. If only the turn-on strength of the resistor 340 is controlled as shown in FIG. 3, it is preferable that the resistor 340 has a resistance higher than the resistors 320, 330 and 340. This makes it possible to correct an error of a wide range although the turn-on strength of only one resistor 340 is controlled.

In FIG. 3, the external resistor 301 is connected to the calibration node ZQ as a pull-down resistor, and the calibration resistor unit 310 is connected to the calibration node ZQ as a pull-up resistor, so that the pull-up calibration codes PCODE<0:5> are generated. Unlike this configuration, in order to generate pull-down calibration codes NCODE<0:5>, the external resistor 301 is connected to the calibration node ZQ as a pull-up resistor, and the calibration resistor unit 310 is connected to the calibration node ZQ as a pull-down resistor. In this case, PMOS transistors should be replaced with NMOS transistors.

The control signals TM0 and TM1 are test mode signals, of which logic levels may be varied according to a mode register set (MRS), cutting information of a fuse circuit, or the like.

Figure 4:
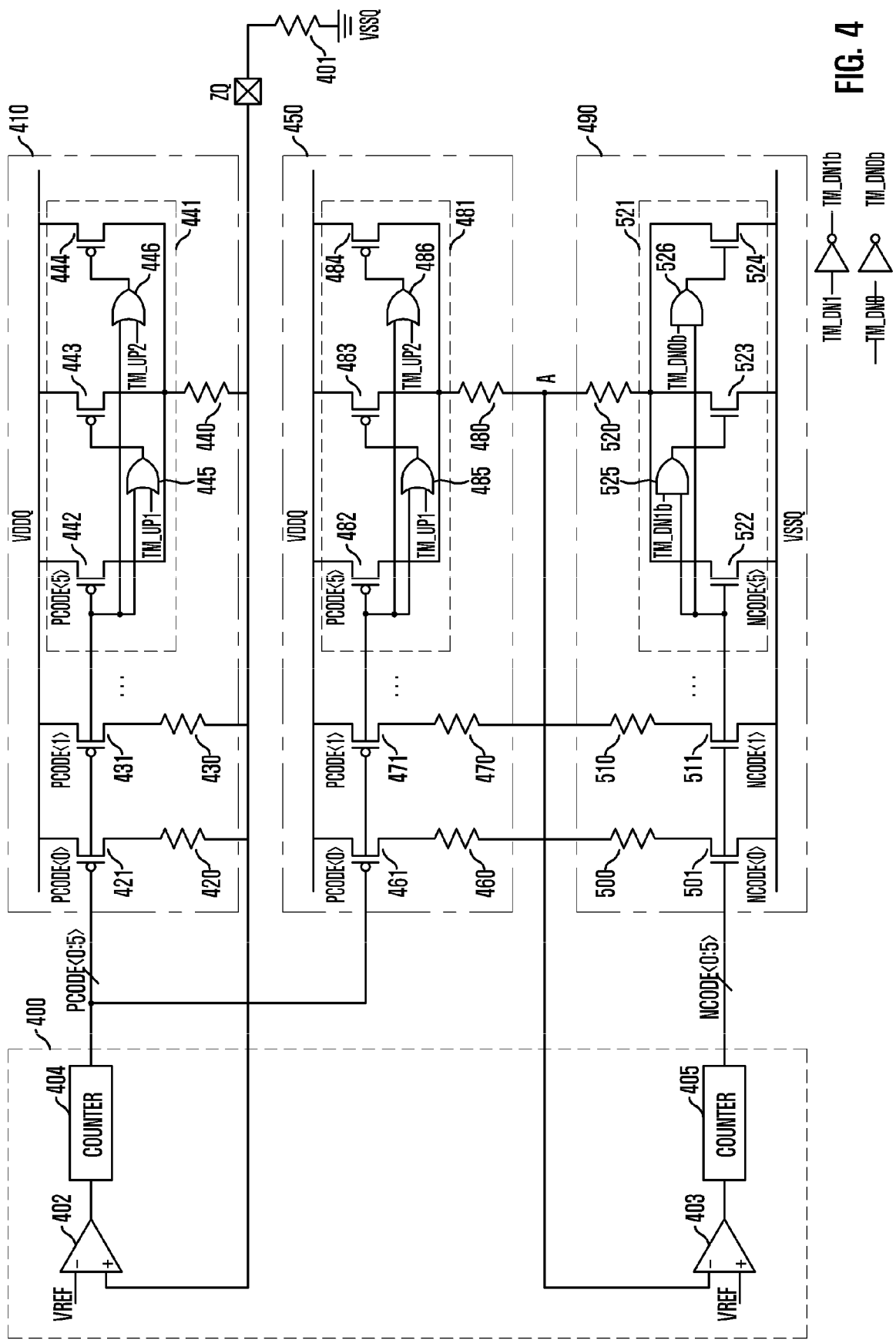
FIG. 4 is a block diagram of a calibration circuit of an ODT device in accordance with another embodiment of the invention.

FIG. 4 is a block diagram of a calibration circuit of an ODT device in accordance with another embodiment of the invention.

Unlike the previous embodiment of FIG. 3, FIG. 4 illustrates that a calibration circuit generates pull-down calibration codes NCODE<0:N> as well as pull-up calibration codes PCODE<0:N>.

Referring to FIG. 4, the calibration circuit of this embodiment includes a code generating unit 400, a pull-up calibration resistor unit 410, a dummy calibration resistor unit 450 and a pull-down calibration resistor unit 490. The code generating unit 400 receives a voltage of a calibration node ZQ and a reference voltage VREF to generate pull-up calibration codes PCODE<0:5>, and receives a voltage of a node A and the reference voltage VREF to generate pull-down calibration codes NCODE<0:5>. The pull-up calibration resistor unit 410 includes pull-up parallel resistors 420, 430 and 440 which are connected to the calibration node ZQ and turned on/off in response to each of the pull-up calibration codes PCODE<0:5>. The turn-on strength of at least one of the pull-up parallel resistors 420, 430 and 440, for example, the pull-up parallel resistor 440, is controlled by pull-up control signals TM_UP0 and TM_UP1. The pull-down calibration resistor unit 490 includes pull-down parallel resistors 520, 530 and 540 which are connected to the node A and turned on/off in response to each of the pull-down calibration codes NCODE<0:5>. The turn-on strength of at least one of the pull-down parallel resistors 520, 530 and 540, for example, the pull-down parallel resistor 520, is controlled by pull-down control signals TM_DN0 and TM_DN1.

The code generating unit 400 includes a first comparator 402 configured to compare the voltage of the calibration node ZQ with the reference voltage VREF, a first counter 404 configured to count the pull-up calibration codes PCODE<0:5> according to the comparison result of the first comparator 402, a second comparator 403 configured to compare the voltage of the node A with the reference voltage VREF, and a second counter 405 configured to count the pull-down calibration codes NCODE<0:5> according to the comparison result of the second comparator 403. Therefore, like the conventional calibration circuit, the pull-up calibration codes PCODE<0:5> have values to make the total resistance of the pull-up calibration resistor unit 410 equal to the external resistor 401, and the pull-down calibration codes NCODE<0: 5> have values to make the total resistance of the pull-down calibration resistor unit 490 equal to the total resistance of the dummy calibration resistor unit 450. In the result, the external resistor 401, the pull-up calibration resistor unit 410, the dummy calibration resistor unit 450 and the pull-down calibration resistor unit 490 have the same resistance.

Specifically, the pull-up calibration resistor unit 410 includes pull-up switches 421, 431 and 441 configured to be turned on/off in response to each of the pull-up calibration codes PCODE<0:5>, and the pull-up parallel resistors 420, 430 and 440 configured to be connected to the calibration node ZQ in parallel and respectively turned on/off by the pull-up switches 421, 431 and 441. Here, the turn-on strength of at least one of the pull-up switches 421, 431 and 441, for example, the pull-up switch 441, is controlled by the pull-up control signals TM_UP0 and TM_UP1. The pull-up calibration resistor unit 410 has the same configuration as the calibration resistor unit (310 of FIG. 3) of the previous embodiment except that only the term 'pull-up' is used right ahead of the term 'calibration resistor unit' for discriminating 'pull-up' function and 'pull-down' function from each other. Hence, further description for the pull-up calibration resistor unit 410 will be omitted herein.

The dummy calibration resistor unit 450 has the same configuration as the pull-up calibration resistor unit 410 except that the node A is pulledup instead of the calibration node ZQ.

The pull-down calibration resistor unit 490 includes pull-down switches 501, 511 and 521 configured to be turned on/off in response to each of the pull-down calibration codes NCODE<0:5>, and the pull-down parallel resistors 500, 510 and 520 configured to be connected to the node A in parallel and respectively turned on/off by the pull-down switches 501, 511 and 521. Here, the turn-on strength of at least one of the pull-down switches 501, 511 and 521, for example, the pull-down switch 521, is controlled by the pull-down control signals TM_DN0 and TM_DN1.

On/off state of the pull-down switch 521 is determined by the pull-down calibration code NCODE<5>, but its turn-on strength is controlled by the pull-down control signals TM_DN0 and TM_DN1.

The pull-down switch 521, of which turn-on strength is controlled, includes a plurality of pull-down transistors 522, 523 and 524 connected in parallel. Therefore, on/off states of the pull-down transistors 522, 523 and 524 are determined by the pull-down calibration code NCODE<5> assigned thereto, but how many pull-down transistors are turned on among the pull-down transistors 522, 523 and 524, that is, number of pull-down transistors 522, 523 and 524 to be used, is determined by the pull-down control signals TM_DN0 and TM_DN1.

To this end, the pull-down switch 521 may be designed such that some of the pull-down transistors 522, 523 and 524, for example, the pull-down transistors 523 and 524, are turned off according to the control signals TM_DN0 and TM_DN1 regardless of the calibration code NCODE<5>. In detail, the pull-down transistors 523 and 524 do not directly receive the calibration code PCODE<5>, but respectively receive output signals of AND gates 525 and 526 performing AND operation on the inversion pull-down control signals TM_DN0B and TM_DN1B and the pull-down calibration code NCODE<5>. Herein, the inversion pull-down control signals TM_DN0B and TM_DN1B denote inversion signals of the pull-down control signals TM_DN0 and TM_DN1, respectively. Accordingly, when the control signals TM0 and TM1 are activated, the pull-down transistors 523 and 524 are always turned off regardless of the pull-down calibration code NCODE<5>.

In this embodiment of FIG. 4, the turn-on strength of the pull-up parallel resistor 440 in the pull-up calibration resistor unit 410 is controlled by the pull-up control signals TM_UP0 and TM_UP1. Likewise, the turn-on strength of the pull-down parallel resistor 520 in the pull-down calibration resistor unit 490 is controlled by the pull-down control signals TM_DN0 and TM_DN1. As similar to the previous embodiment of FIG. 3, values of the pull-up calibration codes PCODE<0:5> can be changed by adjusting logic levels of the pull-up control signals TM_UP0 and TM_UP1, and values of the pull-down calibration codes NCODE<0:5> can also be changed by adjusting logic levels of the pull-down control signals TM_DN0 and TM_DN1.

Therefore, a mismatch between the calibration circuit and the termination circuit (e.g., output driver) is corrected by simply adjusting the logic levels of the control signals TM_UP0, TM_UP1, TM_DN0 and TM_DN1. The resistance of each of the pull-up and pull-down termination resistor units may be equal to the target resistance.

Although FIG. 4 exemplarily illustrates that the turn-on strength of only one resistor 440 is controlled among the pull-up resistors 420, 430 and 440 in the pull-up calibration resistor unit 410 and the turn-on strength of only one resistor 520 is controlled among the pull-down resistors 500, 510 and 520 in the pull-down calibration resistor unit 490, the invention is not limited thereto. Therefore, the invention is also applicable to the case where the turn-on strengths of a plurality of resistors, for example, the pull-up resistors 430 and 440 and the pull-down resistors 510 and 520, are controlled. If the turn-on strength of only one resistor 440 or 520 is controlled as shown in FIG. 4, it is preferable that the resistor 440 or 520 has a resistance higher than the resistors 420, 430 and 440 or 500, 510 and 520. This makes it possible to correct an error of a wide range although the turn-on strength of only one resistor 440 or 520 is controlled.

The pull-up and pull-down control signals TM_UP0, TM_UP1, TM_DN0 and TM_DN2 are test mode signals, of which logic levels may be varied according to a mode register set (MRS), cutting information of a fuse circuit, or the like.

As described above, in a calibration circuit of an ODT device in accordance with the invention, it is possible to control turn-on strength of some or all of parallel resistors according to a control signal. Therefore, the total resistance of a calibration resistor unit is changed, leading to a change in calibration code. Accordingly, the calibration circuit of the invention is advantageous in that it is possible to correct an error or mismatch between a target resistance and a termination resistance by simply controlling the turn-on strength using the control signal.

While the invention has been described with respect to the specific embodiments, it will be apparent to those skilled in the art that various changes and modifications may be made without departing from the spirit and scope of the invention as defined in the following claims.

What is claimed is:

1. A calibration circuit of an on-die termination (ODT) device, comprising:

a code generating unit configured to receive both a voltage of a calibration node and a reference voltage, to generate calibration codes; and a calibration resistor unit including switches and parallel resistors connected to the calibration node through the switches in parallel, wherein each of the switches is turned on/off in response to corresponding one of the calibration codes and at least one of the switches have a turn-on strength controlled by a control signal.

2. The calibration circuit as recited in claim 1, wherein the switch controlled by the control signal includes a plurality of transistors connected in parallel, on/off states of the transistors being determined by the corresponding one of the calibration codes assigned to switch, the control signal determining how many transistors are turned on.

3. The calibration circuit as recited in claim 1, wherein the switch controlled by the control signal includes a plurality of transistors which are connected in parallel and turned on/off in response to the corresponding one of the calibration codes assigned to the switch, at least one of the transistors being turned off according to the control signal regardless of the calibration code assigned to the switch.

4. The calibration circuit as recited in claim 1, wherein the switch controlled by the control signal includes a plurality of PMOS transistors connected in parallel and turned on/off in response to the corresponding one of the calibration codes assigned to the switch, at least one of the PMOS transistors, instead of directly receiving the corresponding one of the calibration codes, receiving an output signal of an OR gate performing an OR operation on the control signal and the calibration code assigned to the switch.

5. The calibration circuit as recited in claim 1, wherein a logic level of the control signal is determined by a mode register set (MRS) or cutting information of a fuse circuit.

6. The calibration circuit as recited in claim 1, wherein each of the parallel resistors connected to the switch controlled by the control signal has a resistance higher than that of the parallel resistors connected to the switches not receiving the control signal.

7. The calibration circuit as recited in claim 1, wherein the code generating unit includes a comparator configured to compare the voltage of the calibration node with the reference voltage, and a counter configured to generate the calibration codes according to a comparison result of the comparator.

8. The calibration circuit as recited in claim 1, wherein the calibration resistor unit is calibrated such that the total resistance of the parallel resistors is equal to a resistance of an external resistor connected to the calibration node.

9. A calibration circuit of an ODT device, comprising:

a code generating unit configured to receive both a voltage of a calibration node and a reference voltage, to generate pull-up calibration codes, and to receive both a voltage of an other node and the reference voltage, to generate pull-down calibration codes; and a pull-up calibration resistor unit including a plurality of pull-up parallel resistors connected to the calibration node and a plurality of pull-up switches, each of which is turned on/off in response to corresponding one of the pull-up calibration codes, at least one of the pull-up switches having a turn-on strength controlled by the pull-up control signal;

a dummy calibration resistor unit having the same configuration as the pull-up calibration resistor unit, and configured to pull-up the other node; and a pull-down calibration resistor unit including a plurality of pull-down parallel resistors connected to the other node and a plurality of pull-down switches, each of which is turned on/off in response to corresponding one of the pull-down calibration codes, at least one of the pull-down switches having a turn-on strength controlled by a pull-down control signal.

10. The calibration circuit as recited in claim 9, wherein the pull-up parallel resistors are connected to the calibration node in parallel through the pull-up switches and the pull-down parallel resistors are connected to the other node in parallel through the pull-down switches.

11. The calibration circuit as recited in claim 10, wherein the pull-up switch controlled by the pull-up control signal includes a plurality of pull-up transistors connected in parallel, on/off states of the pull-up transistors being determined by the corresponding one of the pull-up calibration codes assigned to the pull-up switch, and the number of the pull-up transistors being turned on is determined by the pull-up control signal; and the pull-down switch controlled by the pull-down control signal includes a plurality of pull-down transistors connected in parallel, on/off states of the pull-down transistors being determined by the corresponding one of the pull-down calibration codes assigned to the pull-down switch, and the number of the pull-down transistors being turned on is determined by the pull-down control signal.

12. The calibration circuit as recited in claim 10, wherein:

the pull-up switch controlled by the pull-up control signal includes a plurality of pull-up transistors which are connected in parallel and turned on/off in response to the corresponding one of the pull-up calibration codes assigned to the pull-up switch, at least one of the pull-up transistors being turned off according to the pull-up control signal regardless of the corresponding one of the pull-up calibration codes assigned to the pull-up switch; and the pull-down switch controlled by the pull-down control signal includes a plurality of pull-down transistors which are connected in parallel and turned on/off in response to the corresponding one of the pull-down calibration codes assigned to the pull-down switch, at least one of the pull-down transistors being turned off according to the pull-down control signal regardless of the corresponding one of the pull-down calibration code assigned to the pull-down switch.

13. The calibration circuit as recited in claim 10, wherein:

the pull-up switch controlled by the pull-up control signal includes a plurality of pull-up transistors which are connected in parallel and turned on/off in response to the corresponding one of the pull-up calibration codes assigned to the pull-up switch, at least one of the pull-up transistors receiving an output signal of an OR gate performing an OR operation on the pull-up control signal and the corresponding one of the pull-up calibration codes assigned to the pull-up transistors, instead of directly receiving the corresponding one of the pull-up calibration codes assigned to the pull-up switch; and the pull-down switch controlled by the pull-down control signal includes a plurality of pull-down transistors which are connected in parallel and turned on/off in response to the corresponding one of the pull-down calibration codes assigned to the pull-down switch, at least one of the pull-down transistors receiving an output signal of an AND gate performing an AND operation on the pull-down control signal and the corresponding one of the pull-down calibration codes assigned to the pull-down transistors, instead of directly receiving the corresponding one of the pull-down calibration codes assigned to the pull-down switch.

14. The calibration circuit as recited in claim 9, wherein logic levels of the pull-up and pull-down control signals are determined by a mode register set (MRS) or cuffing information of a fuse circuit.

15. The calibration circuit as recited in claim 9, wherein the pull-up parallel resistors connected to the pull-up switch controlled by the pull-up control signal has a resistance higher than that of the pull-up parallel resistors connected to the pull-up switches not controlled by the pull-up control signal; and of the pull-down parallel resistors connected to the pull-down switch controlled by the pull-down control signal has a resistance higher than that of the pull-down parallel resistors connected to the pull-down switches not receiving the pull-down control signal.

16. The calibration circuit as recited in claim 9, wherein the code generating unit includes:

a first comparator configured to compare the voltage of the calibration node with the reference voltage;

a first counter configured to generate the pull-up calibration codes according to a comparison result of the first comparator;

a second comparator configured to compare the voltage of said other node with the reference voltage; and a second counter configured to generate the pull-down calibration codes according to a comparison result of the second comparator.

17. The calibration circuit as recited in claim 9, wherein the pull-up calibration resistor unit is calibrated such that total resistance of the pull-up parallel resistors is equal to a resistance of an external resistor connected to the pull-up calibration node; and the pull-down calibration resistor unit is calibrated such that total resistance of the pull-down parallel resistors is equal to a resistance of the dummy resistor unit.

* * * * *